(12) United States Patent
Romanovskyy (10) Patent No.: US 8,611,163 B2
(45) Date of Patent: Dec. 17, 2013

(54) DIGITAL DLL FOR TIMING CONTROL IN SEMICONDUCTOR MEMORY

(75) Inventor: Sergiy Romanovskyy, Ottawa (CA)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 452 days.

(21) Appl. No.: 13/052,157

(22) Filed: Mar. 21, 2011

(65) Prior Publication Data
US 2012/0243353 A1 Sep. 27, 2012

(51) Int. Cl.
*G11C 7/00* (2006.01)
(52) U.S. Cl.
USPC ............. 365/194; 365/233.12; 365/230.02
(58) Field of Classification Search
USPC ................ 365/194, 233.12, 230.02
See application file for complete search history.

(56) References Cited

U.S. PATENT DOCUMENTS

| 7,577,056 | B2 | 8/2009 | Hsu | |
|---|---|---|---|---|
| 8,085,074 | B1 * | 12/2011 | Janardhanan et al. | 327/158 |
| 2002/0003747 | A1 * | 1/2002 | Yahata et al. | 365/233 |
| 2008/0025117 | A1 * | 1/2008 | Yu et al. | 365/194 |
| 2008/0252352 | A1 | 10/2008 | Hsu | |

FOREIGN PATENT DOCUMENTS

| KR | 1020050096829 A | 6/2005 |
|---|---|---|
| KR | 1020070117145 A | 12/2007 |

OTHER PUBLICATIONS

Morishita, F. et al., "A 312-MHz 16-Mb Random-Cycle Embedded DRAM Macro With a Power-Down Data Retention Mode for Mobile Applications", IEEE Journal of Solid-State Circuits, Jan. 2005, 40(1):204-212.
Yang, R.J. et al., "A 2.5 GHz All-Digital Delay-Locked Loop in 0.13 μm CMOS Technology", IEEE Journal of Solid-State Circuits, Nov. 2007, 42(11):2338-2347.
Maymandi-Nejad, M. et al., "A Monotonic Digitally Controlled Delay Element", IEEE Journal of Solid-State Circuits, Nov. 2005, 40(11):2212-2219.
Anand, D. et al., "A 1.0GHz multi-banked embedded DRAM in 65 nm CMOS featuring concurrent refresh and hierarchical BIST", IEEE CICC Dig. Tech. Papers, Sep. 2007, pp. 795-798.
Jacunski, M. et al., "A 45nm SOI Compiled Embedded DRAM with Random Cycle Times Down to 1.3ns", CICC, Sep. 2010, pp. 1-4.
Geannopoulos, G. et al, "An Adaptive Digital Deskewing Circuit for Clock Distribution", IEEE ISSCC, Session 25—Clock Networks/Paper SP 25.3, Feb. 1998, pp. 400-401.
Romanovsky, S. et al., "A 500-MHz Random-Access Embedded 1 Mb DRAM Macro in Bulk CMOS", IEEE ISSCC, Session 14—Embedded & Graphics DRAMs—14.1, Feb. 2008, pp. 270-271.
Official Action issued Dec. 5, 2012 in counterpart Korean Patent Application.
Notice of Allowance issued Jun. 7, 2013, in counterpart Korean Patent Application No. 10-2011-0081346.
Wang, J.S. et al., An Ultra-Low-Power Fast-Lock-In Small-Jitter All-Digital DLL, 2005 IEEE International Solid-State Circuits Conference, Session 22/PLL, DLL, and VCOs/ 22.7, 3 pages.

* cited by examiner

*Primary Examiner* — Tuan T. Nguyen
(74) *Attorney, Agent, or Firm* — Duane Morris LLP (57) ABSTRACT

A semiconductor memory includes a delay locked loop (DLL) configured to generate a timing code based on a clock signal. A plurality of memory devices are coupled to the DLL. Each of the plurality of memory devices is configured to generate internal control signals for operating a memory array based on the timing code received from the DLL.

20 Claims, 6 Drawing Sheets

| Code | S0 0 | S0 1 | S0 2 | S0 3 | S0 4 | S0 5 | S0 6 | S0 7 | S0b 0 | S0b 1 | S0b 2 | S0b 3 | S0b 4 | S0b 5 | S0b 6 | S0b 7 | S1 0 | S1 1 | S1 2 | S1 3 | S1 4 | S1b 0 | S1b 1 | S1b 2 | S1b 3 | S1b 4 |
|---|---|---|---|---|---|---|---|---|---|---|---|---|---|---|---|---|---|---|---|---|---|---|---|---|---|---|
| 0 | 1 | 0 | 0 | 0 | 0 | 0 | 0 | 0 | 0 | 1 | 1 | 1 | 1 | 1 | 1 | 1 | 0 | 0 | 0 | 0 | 0 | 1 | 1 | 1 | 1 | 1 |
| 1 | 1 | 1 | 0 | 0 | 0 | 0 | 0 | 0 | 0 | 0 | 1 | 1 | 1 | 1 | 1 | 1 | 0 | 0 | 0 | 0 | 0 | 1 | 1 | 1 | 1 | 1 |
| 2 | 1 | 1 | 1 | 0 | 0 | 0 | 0 | 0 | 0 | 0 | 0 | 1 | 1 | 1 | 1 | 1 | 0 | 0 | 0 | 0 | 0 | 1 | 1 | 1 | 1 | 1 |
| 3 | 1 | 1 | 1 | 1 | 0 | 0 | 0 | 0 | 0 | 0 | 0 | 0 | 1 | 1 | 1 | 1 | 0 | 0 | 0 | 0 | 0 | 1 | 1 | 1 | 1 | 1 |
| 4 | 1 | 1 | 1 | 1 | 1 | 0 | 0 | 0 | 0 | 0 | 0 | 0 | 0 | 1 | 1 | 1 | 0 | 0 | 0 | 0 | 0 | 1 | 1 | 1 | 1 | 1 |
| 5 | 1 | 1 | 1 | 1 | 1 | 1 | 0 | 0 | 0 | 0 | 0 | 0 | 0 | 0 | 1 | 1 | 0 | 0 | 0 | 0 | 0 | 1 | 1 | 1 | 1 | 1 |
| 6 | 1 | 1 | 1 | 1 | 1 | 1 | 1 | 0 | 0 | 0 | 0 | 0 | 0 | 0 | 0 | 1 | 0 | 0 | 0 | 0 | 0 | 1 | 1 | 1 | 1 | 1 |
| 7 | 1 | 1 | 1 | 1 | 1 | 1 | 1 | 1 | 0 | 0 | 0 | 0 | 0 | 0 | 0 | 0 | 0 | 0 | 0 | 0 | 0 | 1 | 1 | 1 | 1 | 1 |
| 8 | 1 | 1 | 1 | 1 | 1 | 1 | 1 | 1 | 0 | 1 | 1 | 1 | 1 | 1 | 1 | 1 | 1 | 0 | 0 | 0 | 0 | 0 | 1 | 1 | 1 | 1 |
| ... | ... | ... | ... | ... | ... | ... | ... | ... | ... | ... | ... | ... | ... | ... | ... | ... | ... | ... | ... | ... | ... | ... | ... | ... | ... | ... |
| 47 | 1 | 1 | 1 | 1 | 1 | 1 | 1 | 1 | 0 | 0 | 0 | 0 | 0 | 0 | 0 | 0 | 1 | 1 | 1 | 1 | 1 | 0 | 0 | 0 | 0 | 0 |

DIGITAL DLL FOR TIMING CONTROL IN SEMICONDUCTOR MEMORY

FIELD OF DISCLOSURE

The disclosed system and method relate to semiconductor memories. More specifically, the disclosed system and method relate to timing controls for multiple eDRAM blocks.

BACKGROUND

Technology scaling allows a great number of system components on a single chip. From 65 nm and below, computational and network chips include multiple cores requiring a large amount of memory per chip. Static random access memory ("SRAM") is often the first choice, given the need for high-speed random access. However, increasing leakage power per transistor makes SRAM less attractive as on-chip memory densities grow. Also, process fluctuations affect SRAM cell stability and decrease static noise margin especially at low voltage. In large power sensitive designs with embedded memory, system designers are turning to embedded DRAM because it is denser, has less power consumption in standby mode, and can have better low-voltage operation.

DETAILED DESCRIPTION

The disclosed systems and methods advantageously enable high-speed operation of an embedded dynamic random access memory ("eDRAM") at low voltages to reduce leakage power, but still retaining stored data. The timing circuitry of the improved semiconductor memory functions over a wide range of process, voltage, and temperature ("PVT") conditions by utilizing a delay locked loop ("DLL"), such as an all-digital delay locked loop ("ADDLL") that produces a digital code for tuning the timing delays in a plurality of eDRAM macros that are coupled to the DLL. The DLL adjusts the propagation through the delay line to match the clock cycle by changing the timing codes that are sent to each of the eDRAM macros such that each eDRAM macro is tuned in the same manner and timing control is independent of PVT conditions. This approach provides that all internal delays stay proportional to the clock cycle even at low voltage operations.

Figure 1:
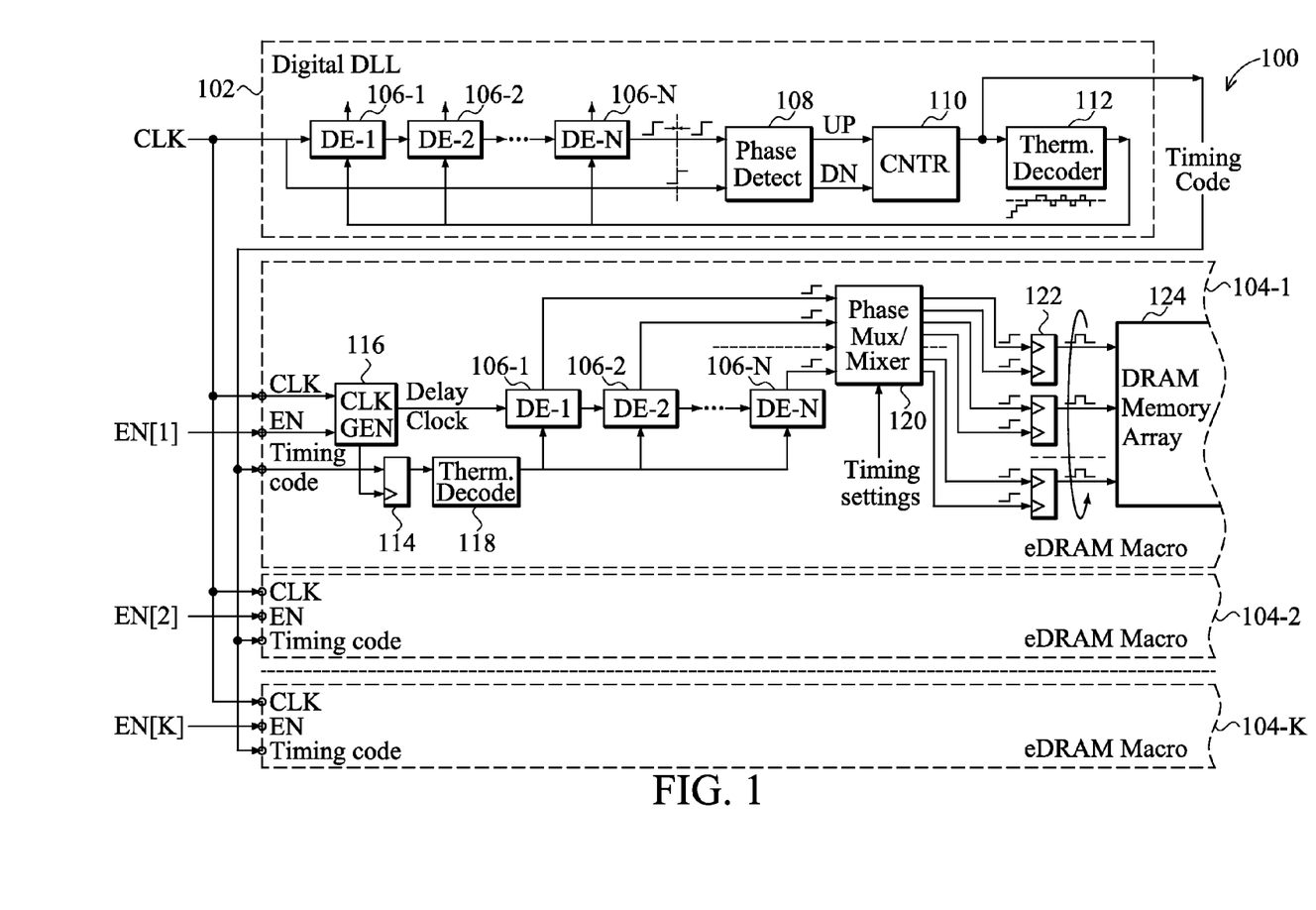
FIG. 1 is a block diagram of one example of a semiconductor memory.

FIG. 1 illustrates one example of an architecture of a semiconductor memory 100 including DLL 102 that controls the timing of a number, K, of embedded dynamic random access memory ("eDRAM") macro devices 104-1, 104-2, 104-K (collectively referred to as "eDRAM device 104" or "eDRAM macro device 104"). Digital DLL 102 includes a plurality of delay elements, 106-1, 106-2, . . . , 106-N (collectively referred to as "delay elements 106") coupled in series with each other, with the first delay element in the series, 106-1, receiving a clock signal, CLK, at its input. The output of the last delay element, 106-N, in the series of delay elements outputs a phase-delayed timing signal to a phase detector 108.

The one or more outputs of phase detector 108 are coupled to an up/down counter 110, which has its output coupled to a thermometer decoder 112 and to a flip-flop 114 in each of the eDRAM macro blocks 104. The output of thermometer decoder 112, which provides a timing code, is also coupled to an input register 114 in each of the eDRAM blocks 104. In addition to an input register 114, each eDRAM block 104 includes a clock generator 116, which receives the clock signal, CLK, at one input and an enable signal, EN, at a second input. The output of clock generator 116 is coupled to a first delay element 106-1 of N delay elements 106 coupled in series. Each of the delay elements 106 in each eDRAM device 104 also receives a signal output from a thermometer decoder 118, which is coupled to the output of flip-flop 114.

Delay elements 106-1, 106-2, . . . 106-3 (collectively referred to as 106) of each eDRAM device 104 output signals to a phase multiplexer/mixer circuit 120, which also receives timing settings that may be stored in a memory or may be pre-programmed. Phase multiplexer/mixer circuit 120 has a plurality of outputs, which are coupled in pairs to a plurality of flip-flops 122. Each of the flip-flops 122 is coupled to a DRAM memory array 124 and provides the control timing signals for operating the array 124. Each of the delay elements 106 of DLL 102 and eDRAM devices 104 may have the same architecture such that the propagation time through delay elements 106 of DLL 102 is the same propagation time through delay elements 106 of eDRAM devices 104.

Figure 2:
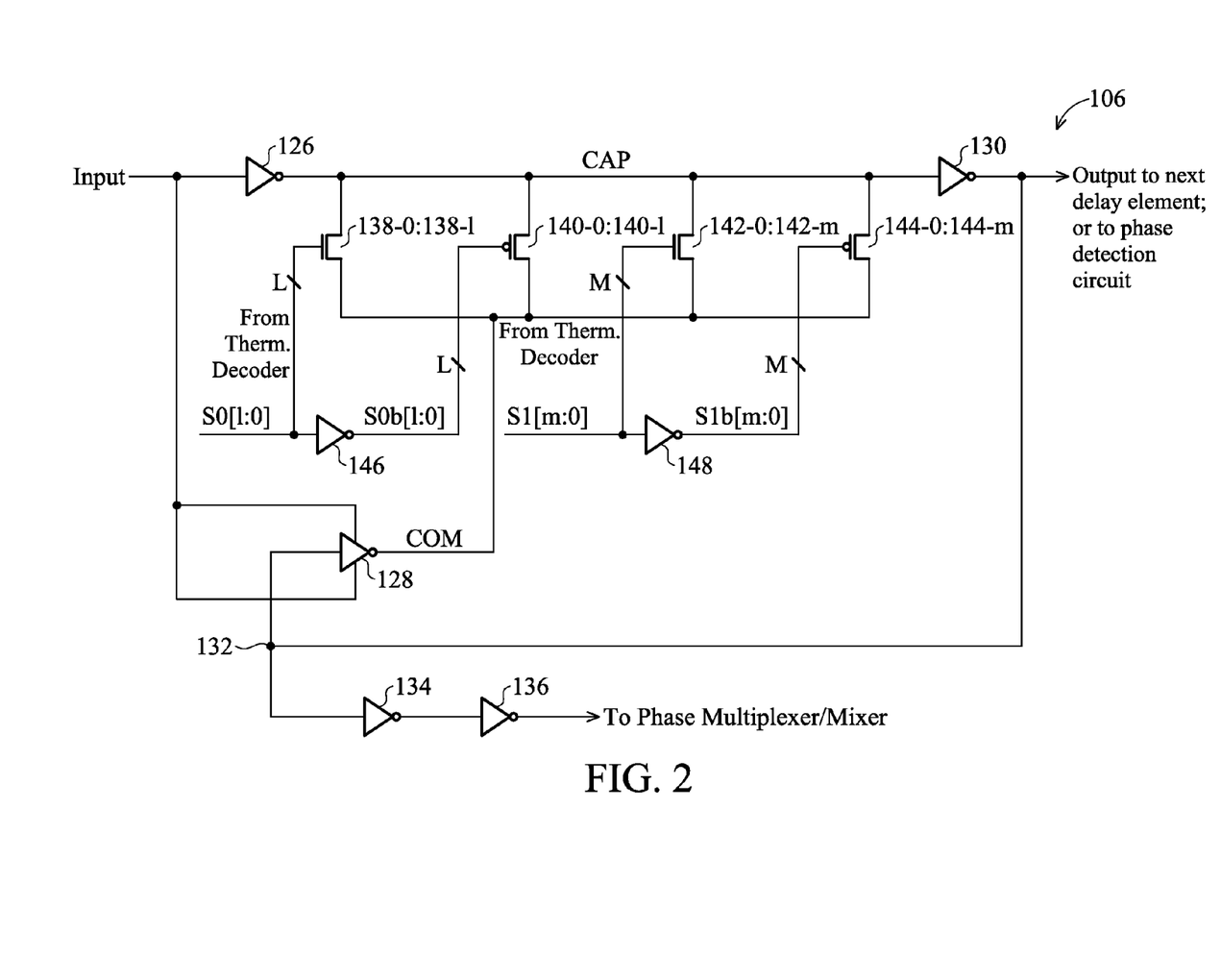
FIG. 2 illustrates one example of a delay element in accordance with the semiconductor memory illustrated in FIG. 1.

In some embodiments, the delay elements 106 have an architecture as illustrated in FIG. 2. As shown in FIG. 2, delay element 106 includes an inverter 126, which serves as a delay device, and a tri-state inverter 128 that serves as a feedback level pre-charge device. Inverter 126 and tri-state inverter 128 receive the clock signal, CLK, a signal from a previous delay element 106, or the delay clock signal from clock generator 116 depending on where the delay element 106 is disposed in the semiconductor memory 100. For example, if the delay element 106 is delay element 106-1 of ADDLL 102, then inverters 126, 128 receive the clock signal, CLK. Inverters 126, 128 receive the delay clock output from clock generator 116 if delay element 106 is the first delay element in the series of delay elements of an eDRAM device 104. If delay element 106 is the second, third, fourth, or subsequent delay element in a series of delay elements, then inverters 126, 128 receive the signal output by the previous delay element 106 in the series of delay devices.

The output of delay device 126 is coupled to node CAP, which is coupled to the input of delay device 130. Tri-state inverter 128 has its input coupled to node 132, which is coupled to the output of delay device 130 and to the input of inverter 134. Serially connected inverters 134 and 136 serve as a non-inverting buffer and provide a signal from the delay element 106 to the phase multiplexer/mixer circuit 120 or to phase detection circuit 108. For example, the output of delay device 136 is coupled to phase detection circuit 108 if delay element 106 is one of the delay elements of digital DLL 102, and the output of delay device 136 is coupled to phase multiplexer/mixer circuit 132 if delay element 106 is one of the delay elements of an eDRAM macro 104.

The output of tri-state inverter 128 is coupled to node COM, which is coupled to the sources of transistors 138-0: 138-1 (collectively referred to as "transistors 138"), 140-0: 140-1 (collectively referred to as "transistors 140"), 142-0: 142-M (collectively referred to as "transistors 142"), and 144-0:144-1 (collectively referred to as "transistors 144"), which are disposed in parallel with each other and each has its respective drain coupled to node CAP. The number, L, of transistors 138 and 140 depends on the number of least significant bits ("LSBs") output from thermometer decoders 112 and 118, with reference letter "l" being equal to L-1. For example, thermometer code generators 110 and 118 may provide eight output signals, e.g., S0[1:0]=S0[7:0], in which case the number, L, of transistors 138 and 140 is eight and 1 is equal to seven. One skilled in the art will understand that the number of LSBs output from thermometer code generators 110 and 118 may be fewer or more than eight.

Each of the transistors 138, which may be NMOS transistors, has its respective gate coupled to one of the outputs of thermometer decoder 112 or 118 that correspond to one of the LSBs output by a thermometer decoder 112, 118 such that the turning on or off of the transistor is controlled by one of the output signals S0[1:0]. Similarly, each of the transistors 140, which may be PMOS transistors, is configured to receive a complementary signal of one of the signals output by thermometer decoder 112 or 118 through inverter(s) 146 such that the turning on and off of transistors 140 is controlled by one of the signals S0b[1:0].

The number, M, of transistors 142-0:142-$m$ (collectively referred to as "transistors 142") and 144-0:144-$m$ (collectively referred to as "transistors 144") is based on the number of most significant bits ("MSBs") output by thermometer code decoders 110, 118, with reference letter "m" equal to M-1. For example, transistor 142 may include five transistors (M=5) with each transistor 142-0:142-4 having a respective gate coupled to one of the five lines output by thermometer decoder 112 or 118 such that the turning on and off of transistors 142 is controlled by one of the output signals S1[4:0]. One skilled in the art will understand that the number of MSBs may be less than or greater than five. Similarly, each of the transistors 144, which may be PMOS transistors, is configured to receive a complementary signal of one of the signals output by thermometer decoder 112 or 118 through inverter(s) 148 such that the turning on and off of transistors 144 is controlled by one of the signals S1b[4:0].

Each respective transistor 142-0:142-$m$ of transistors 142 also includes a number, L, of transistors equal to the number of LSBs output by thermometer decoders 112 or 118 such that each transistor 142-0:142-$m$ has an effective size that is equal to the number of LSBs. For example, if there are eight LSBs (L=8) and transistors 138, 140 and five MSBs (M=5) and transistors 142, 144, then each of the transistors 142-0:142-$m$ includes eight (L=8) transistors disposed in parallel with each other. The transistors comprising transistors 142:0:142-$m$ are each of the same size as transistor 138. Providing transistors 138, 140 with an equal number of transistors disposed in parallel with each other as the number of LSBs advantageously enables the delay line of semiconductor memory 100 to have improved linearity of operation as described in greater detail below.

Figure 3:
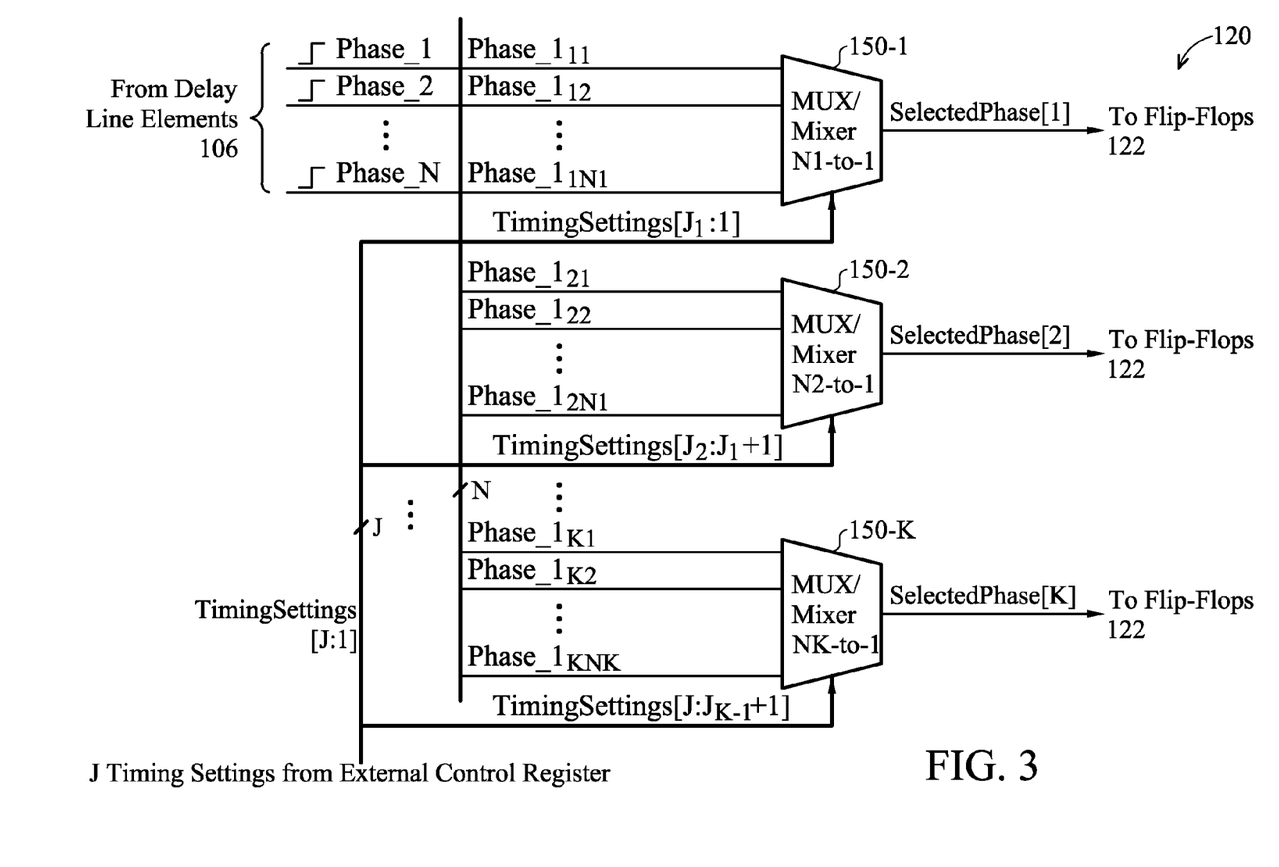
FIG. 3 illustrates one example of a multiplexer/mixer circuit in accordance with the semiconductor memory illustrated in FIG. 1.

FIG. 3 illustrates one example of a multiplexer/mixer circuit 120 in accordance with semiconductor memory illustrated in FIG. 1. As shown in FIG. 3, Multiplexer/mixer circuit 120 includes a plurality of multiplexers 150-1, 150-2, and 150-K (collectively referred to as "multiplexers 150" or "muxes 150") each configured to receive one or more signals from delay elements 106 of an eDRAM device 104. Although three muxes 150 are illustrated, one skilled in the art will understand that the number of muxes, K, may be greater than or less than three.

Each of the K muxes 150 is configured to receive each of the N signals output by the inverters 136 of the N delay elements 106. Each multiplexer/mixer 150 also receives J timing settings from a control register (not shown) in which J is an integer that is greater than or equal to one. Each of the muxes 150 has an output that is coupled to one of the inputs of a flip-flop 122 as illustrated in FIG. 1.

Figure 4:
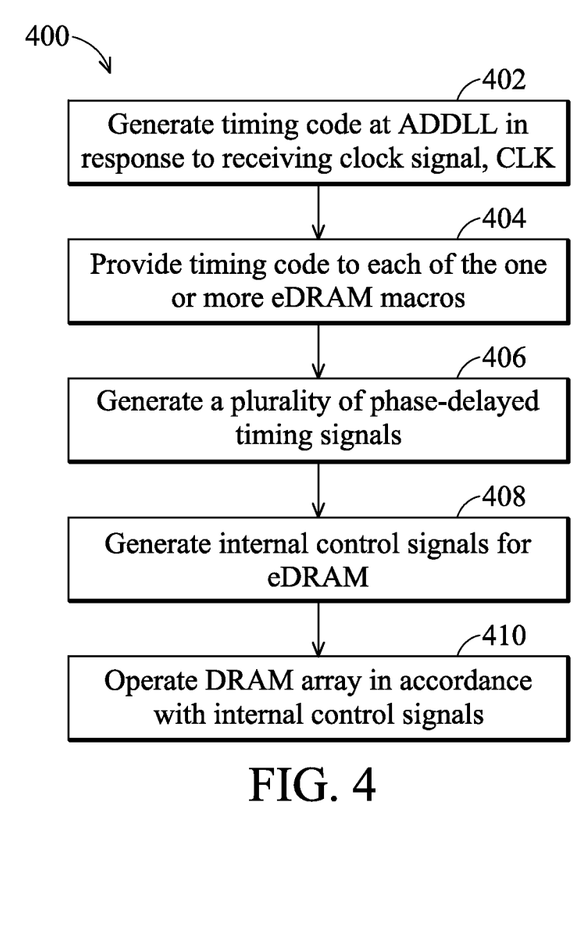
FIG. 4 is a flow chart illustrating one example of a method of operation of the semiconductor memory illustrated in FIGS. 1, 2, and 3.

The operation of semiconductor memory is described with reference to FIGS. 1-4 in which FIG. 4 is a flow chart illustrating one example of a method 400 of operation of a semiconductor memory 100. At block 402, ADDLL 102 generates timing code in response to receiving clock signal, CLK. Timing code is generated as a result of aligning phases of the clock signal CLK delayed by the delay line that includes the N delay elements 106 of ADDLL 102 with input clock signal CLK. The method of operation of a single delay element 106 is described, but one skilled in the art will understand that each of the delay elements 106 may operate in a similar or same manner.

For example, the clock signal is received at the input of a delay element 106 and is output to node CAP, which is disposed between the output of delay device 126 and the input of delay device 130. Transistors 138, 140, 142, and 144 each receive a respective bit of a multi-bit decoded thermometer code output from thermometer decoder 110 at their respective gates that turns the transistors 138, 140, 142, and 144 into a current-conducting "on" state or in an "off" state in which current is substantially prevented from passing through these transistors.

Figure 5:
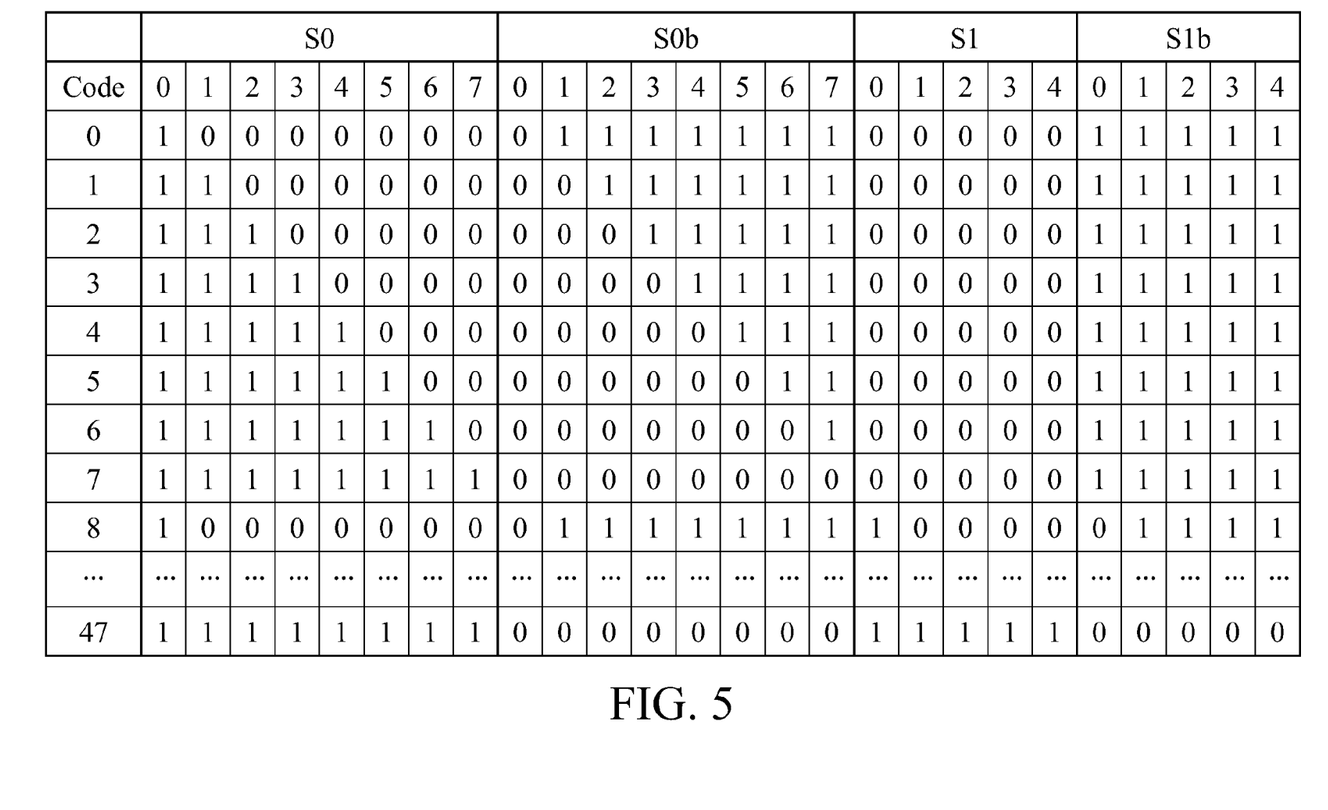
FIG. 5 is a table illustrating an example of a timing code and the corresponding decoded timing code signals provided by a thermometer decoder to the gates of the transistors of the delay elements.

FIG. 5 is a table illustrating one example of the various signals provided by a thermometer decoder 112 (or thermometer decoder 118) configured to provide 13 output signals. As shown in FIG. 5, when thermometer decoder 112 outputs a code zero, signal S0[0] is set at a logic one or high and signals S0[7:1] are set at logic zeroes or lows. With only signal S0[0] being set at a logic one, then transistor 138-0 is turned on and transistors 138-1:138-7 are turned off. Similarly, transistor 140-0 is on and transistors 140-1:140-7 are off due to delay device 146 providing signals S0b[7:0] to the gates of transistors 140. Transistors 142 and 144 are all in an off state for codes 0-7 since transistors 142 each receive a logic low at their respective gates and transistors 144 each receive a logic one at their respective gates.

For codes 8-15, transistors 142-0 and 144-0 are turned on and transistors 142-1:142-4 and 144-1:144-4 are turned off. Since transistor 142-0 includes an equal number of transistors as the number of LSBs, i.e., L, which in this example is eight, the load of turning on one of transistors 142 is approximately equal to the load of eight of transistors 138. Similarly, turning on one of transistors 144 is approximately equal to the load of eight of transistors 140. A larger load at node CAP corresponds to a larger propagation delay as transistors 138, 140, 142, and 144 behave as transmission gates between nodes CAP and COM as well as controlled capacitors. For example, when all of transistors 138, 140, 142, and 144 in a delay element 106 are turned off, the capacitance of node CAP includes the routing and junction capacitances. When one of the plurality of transistors 138, 140, 142, and 144 is turned on, the capacitance through the transistor's channel is added to the capacitance of node CAP, which increases the load for inverter 126. The increased load on inverter 126 increases the amount of time it takes inverter 126 to change the voltage at node CAP, which increases the delay provided by a delay element 106.

The load corresponding to code 7 is created by eight transistors 138-0, . . . , 138-7 and eight transistors 140-0, . . . , 140-7, and the load corresponding to code 8 is created by one transistor 138-0, one transistor 140-0, one transistor 142-0 and one transistor 144-0. However, each transistor 142 consists of eight transistors of 138, and each transistor 144 consists of eight transistors of 140, for example. Consequently, the load corresponding to code 8 is equivalent to 9 transistors of 138 and 9 transistors of 140, i.e., code variation from 7 to 8 changes load by 1 transistor 138 and one transistor 140. Each code transition results in approximately the same number of transistors being turned on and thus the same amount of delay being added such that relationship between the timing code and delay is approximately linear.

The signal at node CAP is inverted and output by delay device 130 and fed back as an input to tri-state inverter 128, which has its output coupled to node COM. The timing signal, i.e., delayed clock signal, output of delay device 130 is received at the input of the next delay element 106 in the series of delay elements 106. The output of delay device 130 in the last delay element 106 of the delay line, i.e., the series of delay elements 106, is coupled to an input of phase detector 108. Phase detector circuit 108 identifies the phase shift of each of the phase-delayed signals received from delay elements 106 by comparing them to clock signal, CLK. Phase detector 108 provides signals to up/down counter 110 identifying if there is an error in the phase of the delayed signal received from delay elements 106. Such delay may be induced by changes in voltage, temperature, and/or clock frequency as will be understood by one skilled in the art. Up/down counter 110 generates the timing code in response to the signals received from phase detector 108.

At block 404, the timing code is provided to each of the one or more eDRAM macro devices 104. Timing codes are received at a register 114 in each of the eDRAM macros 104, which forwards the timing code to thermometer decoder 118 in response to receiving clock signal CLK. Clock generator 116 provides clock signal, CLK, to delay element 106-1, which also receives the thermometer code from thermometer code 118.

At block 406, delay elements 106 of each eDRAM macro 104 generate a plurality of phase-delayed signals. The manner in which delay elements 106 generate phase-delayed signals to phase multiplexer/mixer circuit 120 is the same as the method described above with respect to delay elements 106 of ADDLL 102. For example, the first delay element 106-1 of an eDRAM macro 104 receives the clock signal from clock generator 116 at its input and the thermometer code at each of the respective gates of transistors 138, 140, 142, and 144 from thermometer decoder 118. The turning on and off of transistors 138, 140, 142, and 144 changes the load on delay device 126 by increasing the capacitance of node CAP as well as the delay time of a delay element 106. The first delay element 106-1 outputs the phase-delayed signal to phase multiplexer/mixer circuit 120 and to the next delay element 106-2. Delay element 106-2 receives the timing signal (i.e., phase-delayed signal from previous delay element) from delay element 106-2 and repeats the process described above. In this manner, each of the delay elements 106 provide phase-delayed signals to phase multiplexer/mixer circuit 120, which also receives pre-programmed timing settings for the eDRAM macro 104.

Multiplexer/mixer circuit 120 selects an optimal phase-delayed signal for use of the control signal. For example, if an interval between phase-delayed is too long, then the multiplexer/mixer circuit 120 generates an intermediate phase delay to be achieved to fine tune the timing of semiconductor memory 100. The selection of the optimal phase-delayed signal is made based on the timing control settings that are received at each of the muxes 150 as illustrated in FIG. 3.

At block 408, internal control signals are generated by flip-flops 122. In some embodiments, flip-flops 122 are synchronous RS flip-flops; however, one skilled in the art will understand that other flip-flops or devices may be implemented to generate internal control signals for DRAM memory array 124. Flip-flops 122 receive a signal pair from phase multiplexer/mixer circuit 120 and provide the control signals to the DRAM array 124 for operating the array at block 410. One signal in each pair creates a front or leading edge of the controlling pulse and the other signal of the signal pair creates the rear or falling edge of the controlling pulse. For example, a signal pair can turn on/off word lines or sense amplifiers in DRAM array 124 as steps of read operations.

In some embodiments, the clock of ADDLL 102 is always running to constantly track voltage and temperature conditions and adjust propagation delay through delay line with clock period, but the clock to eDRAM macros 104 can be turned off during standby. This improves adequacy of timing code to voltage, temperature and clock variations and reduces standby current. In some embodiments, the area of DLL block is less than 2% of the eDRAM array area.

EXAMPLE

A 2.25 Mb embedded dynamic random access memory ("eDRAM") macro was designed, fabricated, and tested. The eDRAM macro had an architecture that includes 32 regular memory banks, with each bank organized into 1184 columns (including redundant columns) and 64 rows. A 33rd bank (redundant bank) is included for 16 independent row repairs.

Each memory cell includes an n-type access transistor and Metal-Insulator-Metal ("MIM") capacitor. A 288b data port had separate input and output data buses. A test chip is fabricated with 192 instances of the 2.25 Mb macro with a built-in self-test ("BIST") block assigned for every eight eDRAM macros.

Each delay line included 20 delay elements that produced 20 different clock phases such that the phase-to-phase delay was five percent (5%) of the clock period. For the operating conditions of TT, 1V, and 115° C., one code step changed the delay per phase by approximately 2 ps. Timing accuracy was observed to stay within approximately two and a half percent (2.5%) of the clock cycle. When operating at 750 MHz, a two and a half percent (2.5%) timing accuracy is approximately equal to 33 ps of accuracy in setting delays over all PVT conditions. The timing circuitry provided reliable operations at 750 MHz, 115° C., 1V, and functionality down to 0.5V, 0° C.

Figure 6:
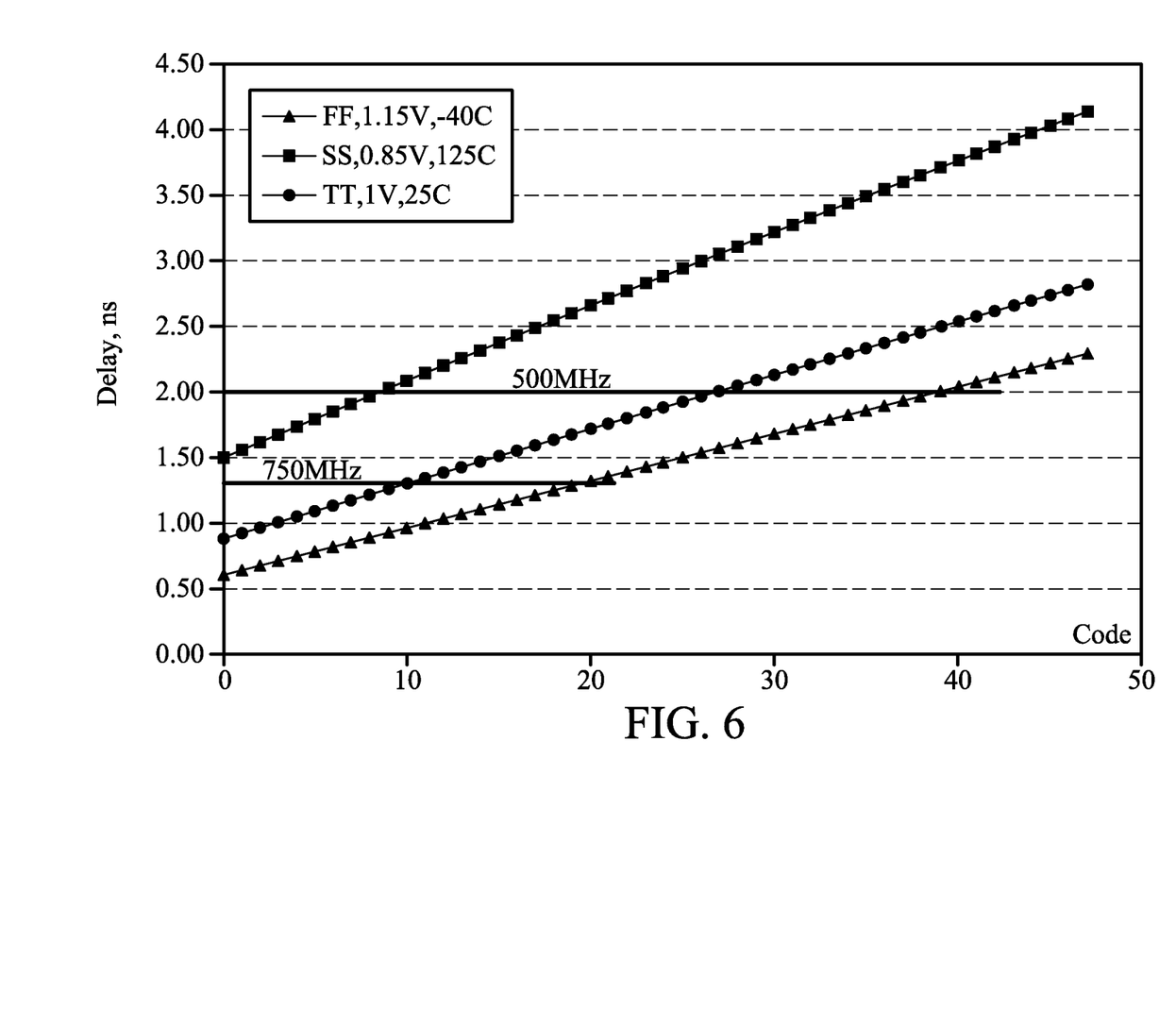
FIG. 6 is a graph illustrating the delay through a plurality of delay elements versus the timing code in accordance with FIG. 5 for different PVT conditions.

FIG. 6 is a graph illustrating the simulation results of a delay through a delay line configured in accordance with FIGS. 1-3 for various PVT conditions. As shown in FIG. 6, the delays for each of the different codes provided by DLL 102 of semiconductor memory 100 have a linear relationship to one another identifying that the increment in the propagation delay is approximately constant for all of the codes.

The disclosed semiconductor memory advantageously enables high-speed operation of an eDRAM as well as the reliable operation at low voltages to reduce leakage power while still retaining stored data. Additionally, the timing circuitry of the improved semiconductor memory functions over a wide range of process, voltage, and temperature ("PVT")

conditions. Sharing the DLL block between multiple eDRAM macros reduces PVT variations such that the internal delays are proportional to the clock cycle even at low voltage operations.

In some embodiments, a semiconductor memory includes a delay locked loop (DLL) configured to generate at least one timing code based on a clock signal and at least one memory device coupled to the DLL. The memory device includes a decoder configured to receive the at least one timing code from the DLL, at least one delay element configured to receive a decoded timing code from the decoder and provide a phase-delayed signal in response, a phase multiplexer/mixer circuit configured to generate control signals based on the clock signal and the phase-delayed signal received from the at least one delay element, and a memory array configured to receive the control signals from the phase mixer circuit.

In some embodiments, a semiconductor memory includes a delay locked loop (DLL) configured to generate a timing code based on a clock signal. A plurality of memory devices are coupled to the DLL. Each of the plurality of memory devices is configured to generate internal control signals for operating a memory array based on the timing code received from the DLL.

In some embodiments, a method includes generating a timing code at a delay lock loop (DLL) circuit based on a clock signal received at the DLL circuit, providing the timing code to each of a plurality of memory devices, and generating internal control signals based on the timing code at each of the plurality of memory devices. A memory array in at least one of the plurality of memory devices is operated based on the control signals generated at the respective one of the plurality of memory devices in which the memory array is disposed.

Although the semiconductor memory and method of operation have been described in terms of exemplary embodiments, they are not limited thereto. Rather, the appended claims should be construed broadly, to include other variants and embodiments of the semiconductor memory and method of operation, which may be made by those skilled in the art without departing from the scope and range of equivalents of the memory and method.

What is claimed is:

1. A semiconductor memory, comprising:
   a delay locked loop (DLL) configured to generate at least one timing code based on a clock signal; and
   at least one memory device coupled to the DLL, the memory device including:
      a decoder configured to receive the at least one timing code from the DLL,
      at least one delay element configured to receive a decoded timing code from the decoder and provide a phase-delayed signal in response,
      a phase multiplexer/mixer circuit configured to generate control signals based on the clock signal and the phase-delayed signal received from the at least one delay element, and
      a memory array configured to receive the control signals from the phase mixer circuit.

2. The semiconductor memory of claim 1, wherein the at least one delay element includes:
   a second delay device having an input coupled to an output of a first delay device,
   a first transistor of a first type having a drain coupled to a first node, to the output of the first delay device, and to the input of the second delay device, a source of the first transistor coupled to an output of a third delay device having an input coupled to an output of the second delay device, and a gate of the first transistor of the first type configured to receive a bit of the decoded timing code and change a state of the first transistor in response thereto,
   wherein the at least one delay element is configured so that a capacitance of the first node is adjustable by a change of state of the first transistor of the first type to alter a delay time of the at least one delay element.

3. The semiconductor memory of claim 2, wherein the decoded timing code includes a plurality of bits and the at least one delay element includes a first plurality of transistors of the first type, each of the first plurality of transistors of the first type having a respective drain coupled to the first node, a respective source coupled to the output of the third delay device, and a respective gate configured to receive a respective one of the plurality of bits of the decoded timing code and change state based on a value of the bit.

4. The semiconductor memory of claim 3, wherein the first plurality of transistors includes the first transistor, the at least one delay element further comprising:
   a second plurality of transistors of the first type disposed in parallel with each other such that each has a drain coupled to the first node, a source coupled to the output of the third delay device, and a gate configured to receive a same bit of the decoded timing code, a number of the first plurality of transistors of the first type equal to a number of the second plurality of transistors of the first type.

5. The semiconductor memory of claim 4, wherein the bit received at the gate of each of the second plurality of transistors of the first type is a most significant bit of the decoded timing code and each of the respective bits received at the gates of the first plurality of transistors of the first type is a least significant bit of the decoded timing code.

6. The semiconductor memory of claim 3, wherein the first plurality of transistors includes the first transistor, the at least one delay element further comprising:
   a first plurality of transistors of a second type each having a drain coupled to the first node and a source coupled to the output of the third delay device, and a gate configured to receive a respective one of a plurality of complementary bits, each of the plurality of complementary bits being the inverse of a respective one of the bits of the decoded timing code.

7. The semiconductor memory of claim 1, wherein the DLL provides the at least one timing code to each of a plurality of memory devices, each of the plurality of memory devices configured to generate internal control signals based on the timing code received from the DLL.

8. The semiconductor memory of claim 1, wherein the DLL includes at least one delay element, the at least one delay element of the DLL including:
   an input node coupled to an input of a first delay device,
   a second delay device having an input coupled to an output of the first delay device,
   a first transistor of a first type having a drain coupled to a first node, to the output of the first delay device, and to the input of the second delay device, a source of the first transistor coupled to an output of a third delay device having an input coupled to an output of the second delay device, and a gate of the first transistor of the first type configured to receive a bit of the decoded timing code and change state in response thereto,
   wherein the at least one delay element is configured so that a capacitance of the first node is adjustable by a change of state of the first transistor of the first type to alter a delay time of the at least one delay element.

9. A semiconductor memory, comprising:
a delay locked loop (DLL) configured to generate a timing code based on a clock signal; and
a plurality of memory devices coupled to the DLL, each of the plurality of memory devices configured to generate internal control signals for operating a memory array based on the timing code received from the DLL.

10. The semiconductor memory of claim 9, wherein each of the memory devices includes:
a first thermometer decoder configured to receive the timing code from the DLL and generate a decoded timing code including a plurality of bits,
a first plurality of delay elements each configured to receive the plurality of bits of the decoded timing code and provide a phase-delayed signal in response,
a phase multiplexer/mixer circuit configured to generate the internal control signals based on the clock signal and the phase-delayed signals received from the plurality delay elements.

11. The semiconductor memory of claim 10, wherein the DLL includes:
a second thermometer decoder configured to receive the timing code and generate a second decoded timing code including a plurality of bits,
a second plurality of delay elements each configured to receive the plurality of bits of the second decoded timing code and provide a phase-delayed signal in response; and
a circuit configured to output the timing code based on the phase delayed signal.

12. The semiconductor memory of claim 11, wherein each of the delay elements include:
an input node coupled to an input of a first inverter,
a second inverter having an input coupled to an output of the first delay device and an output coupled to a third inverter,
a first plurality of transistors of a first type, each of the first plurality of transistors of the first type having a respective drain coupled to a first node disposed between the output of the first inverter and the input of the second inverter, a respective source coupled to an output of the third inverter, and a respective gate configured to receive one of the plurality of bits of the decoded timing code,
wherein each delay element is configured so that a capacitance of the first node is adjustable by a change of state of at least one of the first plurality of transistors of the first type to alter a delay time of the delay element.

13. The semiconductor memory of claim 12, wherein each delay element includes:
a second plurality of transistors of the first type each having a drain coupled to the first node and a source coupled to the output of the third inverter, and a gate configured to receive a same bit of the decoded timing code, a number of the first plurality of transistors of the first type equal to a number of the second plurality of transistors of the first type.

14. The semiconductor memory of claim 12, wherein each delay element includes:
a first plurality of transistors of a second type each having a drain coupled to the first node and a source coupled to the output of the third inverter, and a gate configured to receive a respective one of a plurality of complementary bits, each of the plurality of complementary bits being the inverse of a respective one of the plurality of bits of the decoded timing code.

15. A method, comprising:
generating a timing code at a delay lock loop (DLL) circuit based on a clock signal received at the DLL circuit;
providing the timing code to each of a plurality of memory devices;
generating internal control signals based on the timing code at each of the plurality of memory devices; and
operating a memory array in at least one of the plurality of memory devices based on the control signals generated at the respective one of the plurality of memory devices in which the memory array is disposed.

16. The method of claim 15, wherein the step of generating the timing code includes:
receiving a clock signal at each of a plurality of delay elements;
delaying the clock signal through each of the plurality of delay elements to produce a phase-delayed clock signal;
detecting a phase delay of the clock signal and the delayed clock signal and generating the timing code in response.

17. The method of claim 15, wherein generating the internal control signals includes:
receiving a timing signal based on the clock signal at an input of a first inverter having an output coupled to an input of a second inverter,
adjusting a capacitance of a node disposed between the output of the first inverter and the input of the second inverter in response to receiving a signal at a gate of a transistor having a drain coupled to the node,
outputting the phase-delayed timing signal from the output of the second inverter, and
generating the internal control signals based on the phase-delayed timing signal.

18. The method of claim 17, wherein the signal at the gate of the transistor corresponds to a bit of a decoded timing code.

19. The method of claim 15, wherein generating the internal control signals includes:
receiving a timing signal based on the clock signal at an input of a first inverter having an output coupled to an input of a second inverter,
decoding the timing code to provide a decoded timing code comprising a first plurality of bits,
receiving a respective one of the first plurality of bits of the decoded timing code at a gate of each of a first plurality of transistors,
receiving a same one of the first plurality of bits of the decoded timing code at a gate of a second plurality of transistors,
outputting the phase-delayed timing signal from an output of the second inverter, and
generating the internal control signals based on the phase-delayed timing signal.

20. The method of claim 19, wherein the bits received at the gates of the first and second plurality of transistors changes a state of the transistors to adjust a capacitance of a node disposed between the output of the first inverter and the input of the second inverter to which a drain of each of the first and second plurality of transistors are coupled.

* * * * *